United States Patent [19]
Schoellkopf

[11] Patent Number: 5,498,983
[45] Date of Patent: Mar. 12, 1996

[54] DEVICE FOR CHECKING THE SKEW BETWEEN TWO CLOCK SIGNALS

[75] Inventor: Jean-Pierre Schoellkopf, Grenoble, France

[73] Assignee: SGS-Thomson Microelectronics S.A., Saint-Genis, France

[21] Appl. No.: 308,080

[22] Filed: Sep. 19, 1994

[30] Foreign Application Priority Data

Oct. 11, 1993 [FR] France .................................. 93 12451

[51] Int. Cl.$^6$ ............................................. G01R 25/00
[52] U.S. Cl. ................... 327/3; 327/7; 327/292; 371/1; 371/22.3; 375/357
[58] Field of Search .................... 327/2, 3, 18, 42, 327/44, 160, 237, 292; 326/95, 47; 371/22.3, 1

[56] References Cited

U.S. PATENT DOCUMENTS

| | | | |
|---|---|---|---|
| 4,072,869 | 2/1978 | Gillow | 307/291 |
| 4,623,805 | 11/1986 | Flora et al. | 307/602 |
| 4,646,297 | 2/1987 | Palmquist et al. | 371/1 |
| 5,095,454 | 3/1992 | Huang | 364/578 |
| 5,122,679 | 6/1992 | Ishii et al. | 307/269 |
| 5,159,279 | 10/1992 | Shenoi et al. | 328/109 |
| 5,309,111 | 5/1994 | McNeely et al. | 328/133 |
| 5,313,476 | 5/1994 | Haberkorn et al. | 371/61 |
| 5,371,417 | 12/1994 | Mirov et al. | 327/115 |
| 5,381,416 | 1/1995 | Vartti et al. | 371/1 |

OTHER PUBLICATIONS

Wescon Conference Record, vol. 36, Nov., 1992, North Hollywood, CA, US.

*Primary Examiner*—Timothy P. Callahan
*Assistant Examiner*—Kenneth B. Wells
*Attorney, Agent, or Firm*—David M. Driscoll; James H. Morris

[57] ABSTRACT

A device checks the skew between two clock signals among a plurality of clock signals having the same frequency. The two clock signals of each possible pair of clock signals respectively enable two successive flip-flops that are initially set at distinct states. The whole set of the flip-flops is connected in a looped shift register configuration. An alarm signal is provided by an Exclusive-OR gate receiving the outputs of two successive flip-flops of the shift register.

26 Claims, 2 Drawing Sheets

DEVICE FOR CHECKING THE SKEW BETWEEN TWO CLOCK SIGNALS

BACKGROUND OF THE INVENTION

1. Field of the Invention

The present invention relates to electronic circuits some elements of which need a clock supplying several clock signals having the same frequency and normally the same phase, and more particularly to a circuit that detects whether the skew between two clock signals is lower than a tolerable maximum limit.

2. Discussion of the Related Art

A large number of circuits include elements, such as flip-flops, counters, etc., which must be synchronized on a common clock signal. On an integrated circuit chip, several elements to be synchronized are distributed, so that the clock signal is provided to those elements through links of distinct lengths, some of the links being substantially longer than others. On an integrated circuit chip, the capacitance of a link increases with its length. A clock link is generally controlled by an amplifier providing a maximum current that is determined by the size of its transistors. Thus, the slope of the edges of a clock signal provided on a line increases with the maximum current of the amplifier and decreases with the length of the line (the line capacitance). A clock signal must exhibit steep edges. Accordingly, if the length of the clock lines is great, the output current of the amplifier must be increased. However, if the current in a line is increased beyond a specific limit, the section of the line must also be increased to prevent the line from being damaged. Generally, the increase in the line section is obtained by increasing the width of the conductors on the chip. This width increase is limited and is often incompatible with a large number of integrated circuit design systems since this increase causes, not only an increase of the chip surface area, but also problems for placing and routing the chip elements.

FIG. 1 represents a commonly used method for distributing a clock on an integrated circuit chip. The integrated circuit elements are grouped in several areas 10 having a compact shape (i.e., a shape that is rectangular or nearly square), so that the links inside these areas each have a length that is as short as possible. To each area 10 a distinct clock signal CK1, CK2, . . . is provided through a respective current amplifier 12. All amplifiers 12 receive a global clock signal CK0 provided by a clock generator 14 through an amplifier 16.

With this configuration, each clock signal CK1, CK2, . . . is provided to a line having a reduced length. Accordingly, to obtain clock signals with edges having a suitable slope, these clock lines do not need to be supplied with very high currents which would require increasing their width.

However, lines CK1, CK2, etc., generally have dissimilar lengths and accordingly dissimilar capacitances. Since amplifiers 12 have substantially identical characteristics, edges with dissimilar slopes are obtained on the clock lines. These dissimilar slopes cause phase-shiftings (skews) between the clock signals. As explained hereinafter, an excessive skew between two clock signals can be detrimental.

To reduce the skew, the shortest clock lines can be lengthened. This method not only complicates the integrated circuit design and increases the chip surface area, but also provides undetermined results depending upon the technology that is used to fabricate the integrated circuit.

Accordingly, a skew will still remain between the various clock signals, even if precautions are taken.

Shift registers are particularly sensitive to skews between the clock signals, when the flip-flops of the registers are in different areas 10, that is, when they are enabled by distinct clock signals.

FIG. 2 represents two D-type flip-flops 20 and 21 connected according to a shift register configuration. Flip-flop 20 is enabled, for example, by the clock signal CK1 and receives a signal to be shifted, for example from a preceding flip-flop, on an input D. Flip-flop 21 is enabled by the clock signal CK2, for example, and receives at its input D the output Q1 of flip-flop 20. In the following example, it is assumed that the input D of flip-flop 20 is at 0 and the outputs Q1 and Q2 are at 1 and 0, respectively.

In normal operation, the 0 at the input of flip-flop 20 is provided to the output Q1 and the 1 of output Q1 is provided to the output Q2 upon the substantially simultaneous occurrence of the two rising edges of signals CK1 and CK2.

FIG. 3A is a timing diagram illustrating the normal operation of the shift register of FIG. 2, in the worst case when the clock signal CK1 is in phase advance by a duration Ts with respect to the clock signal CK2.

At time $t_1$, a rising edge of the clock signal CK1 occurs. The input D of the flip-flop 20 is at 0, the output Q1 of flip-flop 20 is at 1 and the output Q2 of flip-flop 21 is at 0. The flip-flop 20 reacts to this rising edge with a delay Tp referred to as a propagation time of the flip-flop. Thus, at time $t_3=T_1+TP$, the output Q1 switches to 0, which is the state present at the input D of flip-flop 20 at time $t_1$.

In the meantime, at time $t_2=t_1+Ts$, a rising edge of the clock signal CK2 occurs. Like the flip-flop 20, the state of the output Q2 of the flip-flop 21 switches with some delay at time $t_4=t_2+Tp$. The output Q2 of flip-flop 21 goes to 1, which is the state present at the input of flip-flop 21 at time $t_2$.

A flip-flop exhibits a so-called holding time Th corresponding to the minimum period during which a state must be maintained at the flip-flop input after its enable time so that this value is effectively taken into account (i.e., transmitted to the flip-flop output). If the signal is not maintained during time Th, the flip-flop erroneously operates. In the example of FIG. 3A, the holding time Th of flip-flop 21 is assumed to be sufficient, which means that Ts<Tp–Th.

FIG. 3B represents an erroneous operation. With respect to the case of FIG. 3A, the skew Ts between the clock signals CK1 and CK2 is increased, so that Ts>Tp–Th. At time $t_4$, the output Q2 switches to the state taken by the output Q1 after time $t_3$, that is the state is held at 0 instead of switching to 1; state 1 is lost.

In a test step of an integrated circuit after manufacturing, when a defect is detected, it is generally difficult to determine the cause of this defect. The defect may be caused by an excessive skew between the various clock signals, but this is difficult to accurately ascertain because the holding time Th of the flip-flop varies from one chip to the other and depends upon the technology that is used.

SUMMARY OF THE INVENTION

An object of the present invention is to provide a control device for checking the skew among a plurality of clock signals to provide an alarm signal, during a test phase of an integrated circuit, when the skew between two clock signals is too high.

To achieve this object, the present invention provides a device for checking the skew between two clock signals among several clock signals having the same frequency. The two clock signals of each possible pair of clock signals respectively enable two successive flip-flops initially set to distinct states, the whole set of the flip-flops being connected in a looped shift register configuration. An alarm signal is provided by an Exclusive-OR gate receiving the outputs of two successive flip-flops of the shift register.

According to an embodiment of the invention, the state of the alarm signal is stored in a flip-flop that is enabled by the complement of one of the clock signals.

The foregoing and other objects, features, aspects and advantages of the invention will become apparent from the following detailed description of the present invention when taken in conjunction with the accompanying drawings.

DETAILED DESCRIPTION

The present invention detects whether the skew between two clock signals is excessive by using a reference shift register whose erroneous operation is detected to enable an alarm signal.

Figure 1:
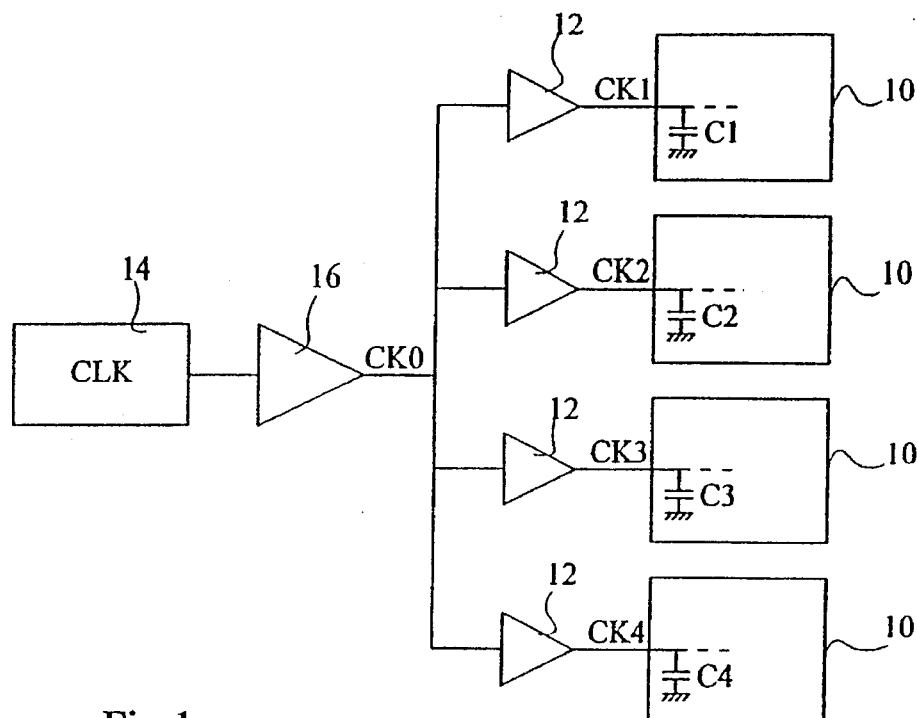
FIG. 1, above described, represents a conventional clock distribution circuit used in an electronic circuit.
Figure 2:
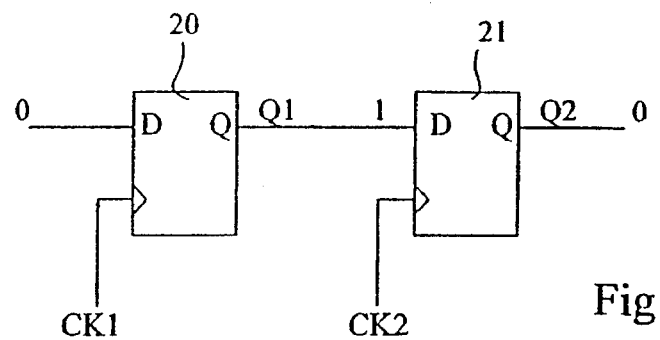
FIG. 2 represents a conventional shift register.
Figure 3A:
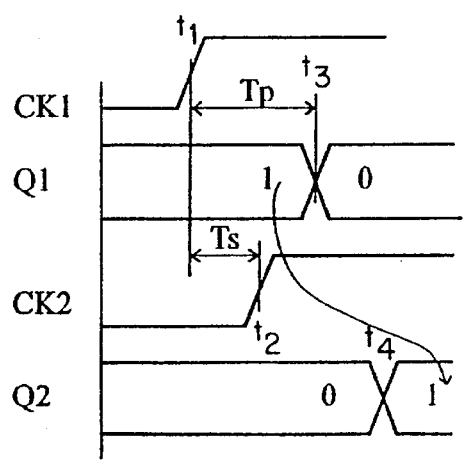
FIG. 3A and 3B are timing diagrams illustrating a correct and an erroneous operation, respectively, of the shift register of FIG. 2.
Figure 3B:
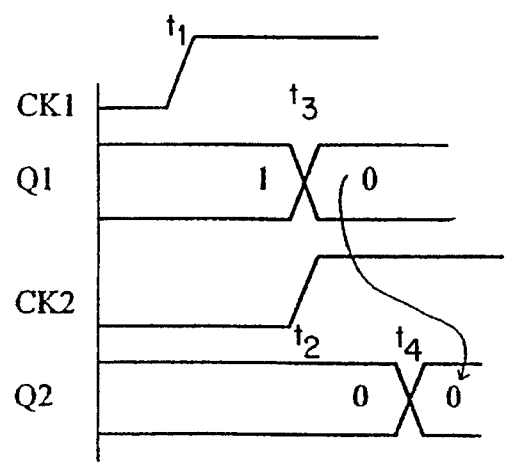
Figure 4:
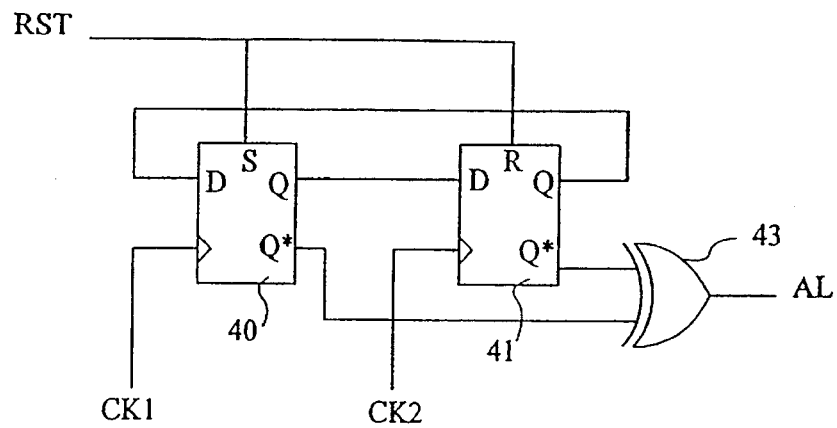
FIG. 4 represents an embodiment of a circuit for checking the skew between two clock signals according to the invention.

FIG. 4 represents such a reference shift register for, according to the invention, detecting an excessive skew between two clock signals CK1 and CK2. Two flip-flops 40 and 41 are connected in a looped shift register configuration, that is, the output Q of flip-flop 40 is connected to the input D of flip-flop 41 and the output of flip-flop 41 is provided to the input D of flip-flop 40. Flip-flop 40 is enabled by the clock signal CK1 and flip-flop 41 is enabled by the clock signal CK2. Moreover, an initialization signal RST is provided to a set input S of the flip-flop 40 and at a reset input R of flip-flop 41. The signal RST is, for example, a signal that is enabled at the switching on of the circuit. An Exclusive-OR gate 43 receives the inverted outputs Q1 of flip-flops 40 and 41. Gate 43 could also receive the non-inverted outputs Q of the flip-flops 40 and 41. The output of gate 43 provides an alarm signal AL.

Upon switching on of the circuit, flip-flop 40 is at 1 and flip-flop 41 is at 0. In normal operation, when the skew between the clock signals CK1 and CK2 is tolerable, the 1 initially in flip-flop 40 is transferred from one flip-flop to the other at each rising edge of the clock signals CK1 and CK2. The inputs of gate 43 are permanently at dissimilar states, accordingly, signal AL is at 1.

If the skew between the clock signals CK1 and CK2 is too high, the 1 or 0 at the output Q of a first flip-flop changes its state too early to allow the other flip-flop to take the change into account. Accordingly, the two flip-flops are maintained at the same state, 1 or 0. The output of gate 43 then goes to 0 and indicates a failure.

If n clock signals CK1–CKn are to be checked, the circuit of FIG. 4 can be used for each pair of signals CKi, CKj where i, j=1, 2, 3, . . . n and i<j. Thus, n(n−1)/2 circuits such as the one of FIG. 4 are needed. All the outputs of gates 43 are then combined in a single OR gate to generate the alarm signal AL.

Figure 5:
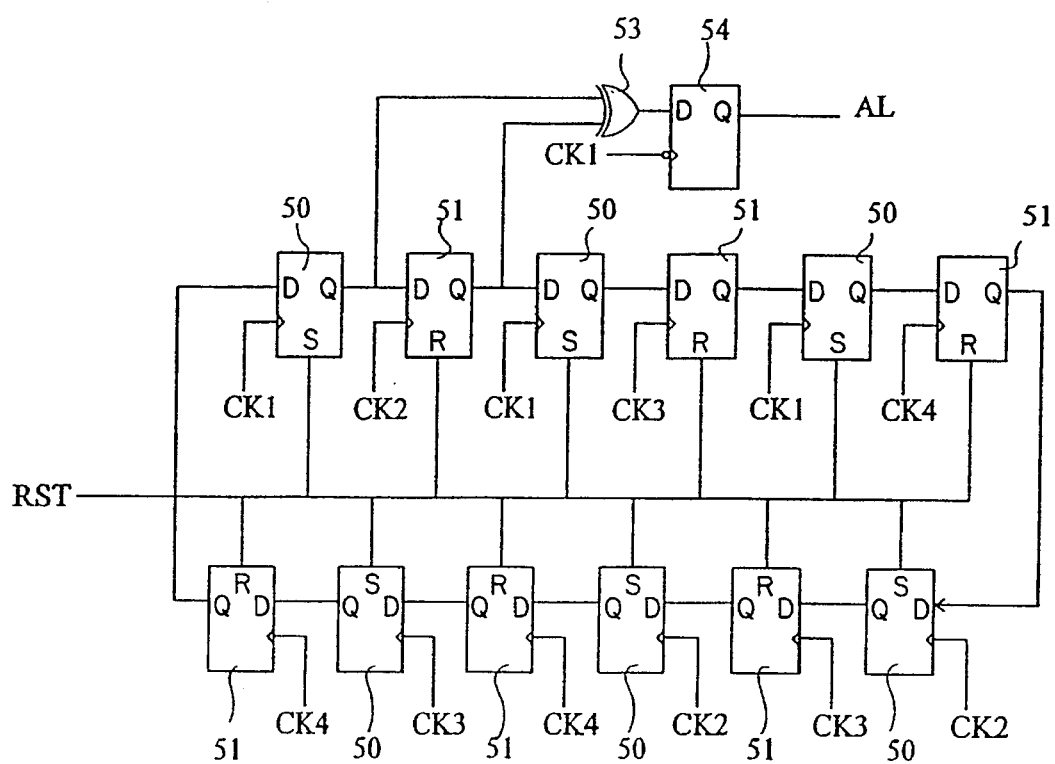
FIG. 5 represents an embodiment of a circuit according to the invention for checking the skew between two clock signals among several clock signals.

FIG. 5 represents a more advantageous embodiment of such a circuit, in an example where n=4. Generally, n(n−1) flip-flops are connected in a looped shift register configuration (number n(n−1) corresponds to the total number of possible pairs of clock signals). A flip-flop, referenced 50, on each two successive flip-flops of the shift register is set to 1 by the initialization signal RST and the other flip-flops, referenced 51, are set to 0 by signal RST. Two successive flip-flops are enabled by two respective clock signals so that the two clock signals of each possible pair enable two successive flip-flops of the shift register. In the example of FIG. 5, the successive flip-flops 50, 51 are accordingly enabled by signal pairs CK1, CK2; CK1, CK3; CK1, CK4; CK2, CK3; CK2, CK4; and CK3, CK4. Of course, many other combinations are possible to obtain the desired result.

An Exclusive-OR gate 53 receives the outputs Q of two successive flip-flops. The output of gate 53 is provided to the input D of a flip-flop 54 that is enabled by the complement of one of the clock signals, for example CK1. The output Q of flip-flop 54 steadily provides the alarm signal AL.

In normal operation, two successive flip-flops, are always at dissimilar states. Thus, the two inputs of gate 53 are at dissimilar states; the alarm signal AL is at 1.

When the skew between two clock signals is great enough to cause erroneous operation, two corresponding successive flip-flops are set to an identical state. The two identical states are shifted at each clock cycle until they reach the two inputs of gate 53. Then, the output of gate 53 goes to 0; this 0 is stored in the flip-flop 54 at the next falling edge of signal CK1. The two identical states remain shifted and the output of gate 53 goes again to 1 but the alarm signal remains stored in flip-flop 54.

With the approach of FIG. 5, a single Exclusive-OR gate is used for n clock signals whereas the approach proposed in FIG. 4 needs n(n−1)/2 Exclusive-OR gates.

A checking device according to the invention occupies a small surface area on an integrated circuit chip. The line providing the alarm signal AL corresponds to a pad of the chip or to an enlarged metallization so that the state of this line can be pin tested during a test step.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. A device for checking a skew between two clock signals among a plurality of clock signals having the same frequency, the device comprising:

a plurality of flip-flops coupled in a looped shift register configuration, wherein each flip-flop has a signal input, a clock input that receives one of the plurality of clock signals, and a signal output coupled to a signal input of another flip-flop, wherein each of a plurality of pairs of the plurality of clock signals respectively enables two successive flip-flops, and wherein each flip-flop is initially set to a predetermined state; and an Exclusive-OR gate having inputs coupled to the signal outputs of a pair of the plurality of flip-flops coupled in the looped shift register configuration, and an output that provides an alarm signal indicative of the skew between the two clock signals among the plurality of clock signals.

2. The device of claim 1, further comprising:

an alarm signal flip-flop that stores a state of the alarm signal, wherein the alarm signal flip-flop is enabled by a complement of one of the plurality of clock signals.

3. A device for checking a skew between a pair of clock signals among a plurality of clock signals, the device comprising:

a plurality of flip-flops, each of the plurality of flip-flops having a signal input, a clock input that receives one of the plurality of clock signals, a signal output that provides an output signal, and a predetermined initial state, the signal output of each of the plurality of flip-flops being coupled to a signal input of another of the plurality of flip-flops so that the pair of clock signals enables two successive flip-flops; and a testing stage coupled to at least two signal outputs of the plurality of flip-flops, the testing stage providing an alarm signal as a function of output signals of the at least two signal outputs, the alarm signal indicating whether the skew between the pair of clock signals is within an acceptable range.

4. The device of claim 3, wherein the pair of clock signals includes a first clock signal and a second clock signal of the plurality of clock signals, and wherein the plurality of flip-flops includes:

a first flip-flop having a first Signal input, a first clock input that receives the first clock signal, and a first signal output; and a second flip-flop having a second signal input coupled to the first signal output, a second clock input that receives the second clock signal, and a second signal output.

5. The device of claim 4, wherein each of the first flip-flop and the second flip-flop has a different logic state as a predetermined initial state.

6. The device of claim 5, wherein the test stage includes logic circuitry having a first input that receives a first output signal from the first signal output of the first flip-flop, a second input that receives a second output signal from the second signal output of the second flip-flop, and an output that outputs the alarm signal as a function of the first and the second output signals.

7. The device of claim 6, wherein the alarm signal has one of a first state and a second state indicating that the skew between the first and the second output signals is within the acceptable range and outside the acceptable range, respectively.

8. The device of claim 5, wherein each flip-flop includes an assertable SET input and an assertable RESET input so that the predetermined initial state of each flip-flop equals a first logic state when the SET input is asserted and a second logic state when the RESET input is asserted.

9. The device of claim 8, wherein the assertable SET input of the first flip-flop, and the assertable RESET input of the second flip-flop each receive an initialization signal to set the predetermined initial state of the first flip-flop to the first logic state, and the predetermined initial state of the second flip-flop to the second logic state.

10. The device of claim 3, wherein the plurality of flip-flops includes a plurality of pairs of flip-flops, each pair of flip-flops receiving two of the plurality of clock signals to check a skew between the two of the plurality of clock signals.

11. The device of claim 10, wherein the testing stage includes exclusive-OR circuitry that receives output signals from the two successive flip-flops and outputs the alarm signal.

12. A device for checking a skew between a pair of clock signals among a plurality of clock signals, the device comprising:

a plurality of means for storing a logic state, each of the plurality of means for storing having a signal input, a clock input. that receives one of the plurality of clock signals, a signal output that provides an output signal, and a predetermined initial state, the signal output of each of the plurality of means for storing being coupled to a signal input of another of the plurality of means for storing so that the pair of clock signals enables two successive means for storing; and means, responsive to at least two output signals of the signal outputs of the plurality of means for storing, for providing an alarm signal as a function of the at least two output signals, the alarm signal indicating whether the skew between the pair of clock signals is within an acceptable range.

13. The device of claim 12, wherein the pair of clock signals includes a first clock signal and a second clock signal of the plurality of clock signals, and wherein the plurality of means for storing includes:

first means for storing having a first signal input, a first clock input that receives the first clock signal, and a first signal output; and second means for storing having a second signal input coupled to the first signal output, a second clock input that receives the second clock signal, and a second signal output.

14. The device of claim 13, wherein each of the first means for storing and the second means for storing has a different logic state as a predetermined initial state.

15. The device of claim 14, wherein the means for providing includes means for receiving a first output signal from the first signal output of the first means for storing, a second output signal from the second signal output of the second means for storing, and outputting an alarm signal as a function of the first and the second output signals.

16. The device of claim 15 wherein the alarm signal has one of a first state and a second state indicating that the skew between the first and the second output signals is within the acceptable range and outside the acceptable range, respectively.

17. The device of claim 14, wherein each means for storing includes means for inputting a SET signal and means for inputting a RESET signal so that the predetermined initial state of each means for storing equals a first logic state when the SET signal is inputted and a second logic state when the RESET signal is inputted.

18. The device of claim 17, wherein the means for inputting a SET signal of the first means for storing, and the means for inputting a RESET signal of the second means for storing each receive an initialization signal to set the predetermined state of the first means for storing to the first logic state, and the predetermined initial state of the second means for storing to the second logic state.

19. The device of claim 12, wherein the plurality of means for storing includes a plurality of pairs of means for storing, each pair of means for storing receiving two of the plurality of clock signals to check a skew between the two of the plurality of clock signals.

20. The device of claim 19, wherein means for providing includes means for receiving output signals from the two successive means for storing, and outputting the alarm signal, the alarm signal being a result of an Exclusive-OR calculation of the received output signals from the two successive means for storing.

21. A method for checking a skew between a pair of clock signals among a plurality of clock signals, the method comprising the steps of:

(A) applying each of a plurality of clock signals to a clock input of each of a plurality of storage elements, each storage element further having a signal input, a signal output coupled to a signal input of another of the plurality of storage elements, and a predetermined initial state, that the pair of clock signals generates an output signal on a signal output of each of two successive storage elements; and (B) providing an alarm signal as a function of the generated output signals, the alarm signal indicating whether the skew between the pair of clock signals of the plurality of clock signals is within an acceptable range.

22. The method of claim 21, further including the step of:

applying an initialization signal to a looped configuration formed by the plurality of storage elements so that the looped configuration is initialized with a series of alternating logic values.

23. The method of claim 22, wherein step (B) includes the step of:

testing the values of the two successive storage elements of the looped configuration.

24. The method of claim 23, wherein step (B) further includes the step of:

outputting the alarm signal as having a first state when the tested values are different and a second state when the tested values are the same.

25. The device of claim 1, wherein the two successive flip-flops includes a first flip-flop and a second flip-flop having a first state and a second state, respectively, the first state being opposite the second state.

26. The device of claim 1, wherein the two successive flip-flops include a first flip flop having a clock input that receives a first clock signal of the plurality of clock signals, and a second flip-flop having a clock input that receives a second clock signal of the plurality of clock signals, the first clock signal and the second clock signal being different.

\* \* \* \* \*

UNITED STATES PATENT AND TRADEMARK OFFICE

CERTIFICATE OF CORRECTION

PATENT NO. : 5,498,983

DATED : March 12, 1996

INVENTOR(S): Jean-Pierre SCHOELLKOPF

It is certified that error appears in the above-identified patent and that said Letters Patent is hereby corrected as shown below:

On the title page item [21] should read:

[21]　　Appl. No.: 308,808

Signed and Sealed this

Twenty-eighth Day of May, 1996

Attest:

BRUCE LEHMAN

*Attesting Officer*　　　*Commissioner of Patents and Trademarks*